US008832933B2

(12) United States Patent
Kuo et al.

(10) Patent No.: US 8,832,933 B2
(45) Date of Patent: Sep. 16, 2014

(54) METHOD OF FABRICATING A SEMICONDUCTOR TEST PROBE HEAD

(75) Inventors: Yung-Hsin Kuo, Zhubei (TW); Wensen Hung, Zhubei (TW); Po-Shi Yao, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 349 days.

(21) Appl. No.: 13/233,079

(22) Filed: Sep. 15, 2011

(65) Prior Publication Data
US 2013/0069683 A1    Mar. 21, 2013

(51) Int. Cl.
*H05K 3/34* (2006.01)
*G01R 3/00* (2006.01)
*H05K 3/00* (2006.01)
*G01R 1/073* (2006.01)
*G01R 1/067* (2006.01)

(52) U.S. Cl.
CPC ............... *G01R 3/00* (2013.01); *H01L 2924/14* (2013.01); *G01R 1/07314* (2013.01); *G01R 1/06744* (2013.01); *H05K 3/00* (2013.01)
USPC .................. 29/840; 29/832; 29/829; 29/825; 29/592.1; 29/846; 29/839; 29/835; 29/837; 29/845; 29/842; 29/447; 29/448; 324/755.03; 324/755.01; 324/754.07; 228/5.1; 228/6.2; 228/13; 228/15.1; 228/123.1; 228/124.1; 228/141.1; 228/170

(58) Field of Classification Search
USPC ........ 29/840, 832, 829, 825, 592.1, 846, 839, 29/835, 837, 845, 842, 447, 448; 324/755.03, 755.01, 754.07, 757, 754, 324/755, 762, 765; 228/5.1, 6.2, 13, 15.1, 228/123.1, 124.4, 141.1, 170
See application file for complete search history.

(56) References Cited

U.S. PATENT DOCUMENTS

| | | | |
|---|---|---|---|
| 5,286,944 A * | 2/1994 | Li | 219/69.15 |
| 2006/0114011 A1 * | 6/2006 | Byrd | 324/754 |
| 2011/0114603 A1 * | 5/2011 | Mai et al. | 219/69.12 |

* cited by examiner

*Primary Examiner* — Peter DungBa Vo
*Assistant Examiner* — Azm Parvez
(74) *Attorney, Agent, or Firm* — Duane Morris LLP (57) ABSTRACT

A testing probe card for wafer level testing semiconductor IC packaged devices. The card includes a circuit board including testing circuitry and a testing probe head. The probe head includes a probe array having a plurality of metallic testing probes attached to a substrate including a plurality of conductive vias. In one embodiment, the probes have a relatively rigid construction and have one end that may be electrically coupled to the vias using a flip chip assembly solder reflow process. In one embodiment, the probes may be formed from a monolithic block of conductive material using reverse wire electric discharge machining.

19 Claims, 12 Drawing Sheets

FIG. 19

METHOD OF FABRICATING A SEMICONDUCTOR TEST PROBE HEAD

TECHNICAL FIELD

The present disclosure generally relates to semiconductors, and more particularly to probes cards for testing integrated circuits formed on a semiconductor wafer.

BACKGROUND

Modern semiconductor fabrication involves numerous steps including photolithography, material deposition, and etching to form a plurality of individual semiconductor devices or integrated circuit chips (dice) on a single semiconductor silicon wafer. Typical semiconductor wafers produced today may be at least about 6 inches or more in diameter, with a 12 inch diameter wafer being one common size. Some of the individual chips formed on the wafer, however, may have defects due to variances and problems that may arise during the intricate semiconductor fabrication process. Prior to wafer dicing wherein the individual integrated circuit chips (dies) are separated from the semiconductor wafer, electrical performance and reliability tests are performed on a plurality of chips simultaneously by energizing them for a predetermined period of time (i.e., wafer level burn-in testing). These tests may typically include LVS (layout versus schematic) verification, IDDq testing, etc. The resulting electrical signals generated from each chip or DUT (device under test) are captured and analyzed by automatic test equipment (ATE) having test circuitry to determine if a chip has a defect.

To facilitate wafer level burn-in testing and electrical signal capture from numerous chips on the wafer at the same time, DUT boards or probe cards as they are commonly known in the art are used. Probe cards are essentially printed circuit boards (PCBs) that contain a plurality of metallic electrical probes that mate with a plurality of corresponding electrical contacts or terminal formed on the wafer for the semiconductor chips. Each chip or die has a plurality of contacts or terminals itself which must each be accessed for testing. A typical wafer level test will therefore require that electrical connection be made between well over 1,000 chip contacts or terminals and the ATE test circuitry. Accordingly, precisely aligning the multitude of probe card contacts with chip contacts on the wafer and forming sound electrical connections is then important for conducting accurate wafer level testing. Probe cards are typically mounted in the ATE and serve as an interface between the chips or DUTs and the test head of the ATE.

As semiconductor fabrication technology advances continue to be implemented, the critical dimension or spacing between electrical test contact pads and bumps (i.e. "pitch") of dies or chips on the semiconductor wafer continues to shrink. The present major trend in semiconductor fabrication is moving towards 3D IC chip packages with heterogeneous chip stacking. Such 3D IC chip packages include DUTs having a TSV (through silicon via) electrical interconnect structure with corresponding micro bump testing contact fine pitch arrays with a micro bump pitch of less than 50 microns ($\mu$m).

A technology bottleneck occurs that is associated with existing known testing probe card designs and assembly techniques that do not readily support such small testing pad micro bump pitches as encountered on 3D IC chip packages. There are limitations associated with existing guide plate manufacturing having closely spaced holes which support small diameter (e.g. 25 microns) needle-like metal testing probe which are flexible and easily bent, guide plate assembly techniques, and probe handling required to manually insert the slender probes through small diameter probe holes (e.g. 30 microns) in the guide plates which is a time-consuming operation and results in all too frequent damage to the structurally thin and weak probes.

An improved testing probe card and method for fabricating the same is therefore desired.

BRIEF DESCRIPTION OF THE DRAWINGS

The features of the embodiments will be described with reference to the following drawings where like elements are labeled similarly, and in which.

All drawings are schematic and are not drawn to scale.

DETAILED DESCRIPTION

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present disclosure. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. Moreover, the features and benefits of the disclosure are illustrated by reference to the embodiments. Accordingly, the disclosure expressly should not be limited to such embodiments illustrating some possible non-limiting combination of features that may exist alone or in other combinations of features; the scope of the disclosure being defined by the claims appended hereto.

As the term may be used herein in describing metallic test probes, rigid shall have its customary meaning of a structure that is generally deficient in or devoid of flexibility.

Figure 1:
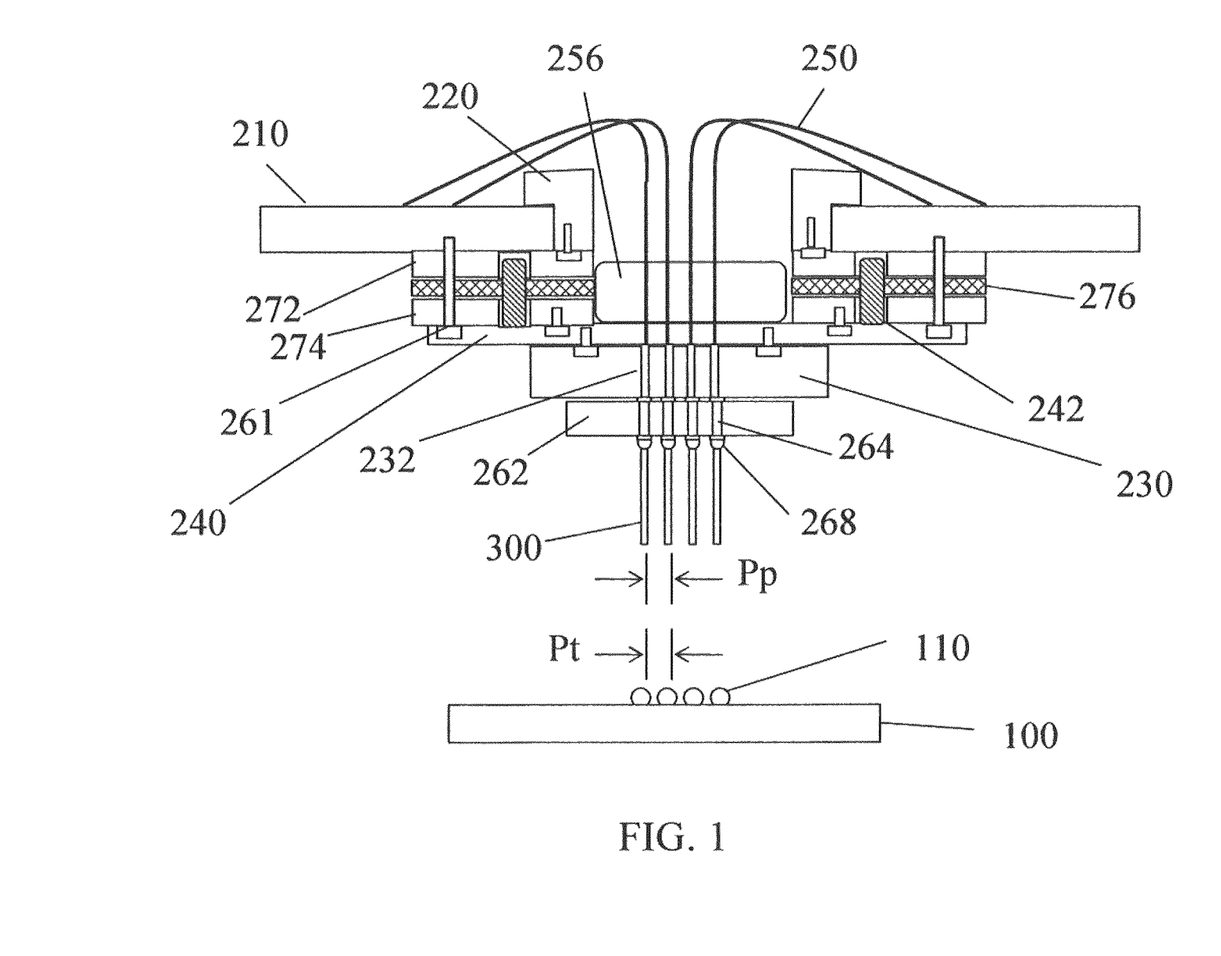
FIG. 1 is a partial cross-sectional side view of an embodiment of a test probe card according to the present disclosure.

FIG. 1 shows one exemplary embodiment of a probe card according to principles of the present disclosure. A probe card 200 generally includes a testing printed circuit board (PCB) 210, space transformer 240, interposer 230, and testing probe head 260 having a laterally extending array including a plurality of testing probes 300 configured and arranged to engage mating testing contacts disposed on a DUT (device under test). Testing PCB 210 includes conventional DUT testing circuitry and active devices as will be well known to those skilled in the art. Testing PCB 210 includes a bottom surface 214 and a top surface 212 that includes an array of electrical contacts for interconnecting with corresponding contacts on the automatic test equipment (ATE) (not shown) for performing wafer level DUT testing. In one embodiment, testing PCB 210 may be made of silicon. Testing PCB 210 includes conventional wafer testing circuitry that is operative to apply an electrical load to a DUT 100 on the wafer, and to receive and process return electrical signals from the DUT which in some embodiments may be associated with wafer level DUT burn-in performance and reliability tests.

Testing probe card 200 further includes a mounting assembly 270 which includes a fixing or mounting ring 220 for securing the probe card to the ATE in a conventional manner. In some embodiments, mounting ring 220 may be made of a suitable metal such without limitation as stainless steel, aluminum, or titanium.

With continuing reference to FIG. 1, mounting assembly 270 in some embodiments may further include an upper metal support plate 272 and lower metal support plate 274 which are positioned in spaced apart relationship. A compressible deformable member such as an elastomeric or rubber insert 276 may be interspersed between the upper and lower support plates 272, 274 in some embodiments as shown to add fleixibility to the relatively rigid testing probes 300 and testing probe head 260. The compressible insert 276 further functions to compensate for potential non-planarity of the testing probe tips, enhance positive contact between the probe tips and testing contacts on the DUTs, and absorb the initial contact impact stresses of engaging the testing probe head 260 with the DUT. Mounting assembly 270 may be secured to mounting ring 220 in any suitable manner including via threaded fasteners 261 as shown.

With continuing reference to FIG. 1, space transformer 240 is disposed between interposer 230 and testing probe head 260. Space transformer 240 includes a substrate that receives and secures the lower ends 252 of a plurality of conductive metal wire leads 250 which pass through the substrate. In some embodiments, the ends of the wire leads 250 may be coupled to contact pads (not shown) disposed on the lower surface of the space transformer similar to surface contact pads 261 shown in FIG. 14. In some embodiments, the space transformer 240 substrate may be a multi-layered organic (MLO) or multi-layered ceramic (MLC) interconnect substrate. The upper ends 254 of wire leads 250 are electrically connected to contacts on the upper surface 212 of the testing PCB 210. The pitch or spacing of lower ends 252 may be smaller or finer than the upper ends 254. An adhesive 256 may be applied on top of space transformer 240 to support and fix the wire leads 250 in place in relation to the space transformer. In one representative embodiment, the adhesive may be any thermally cured adhesive from common suppliers such as Henkel, 3M, Shinetsu and Loctite.

Space transformer 240 may include one or more guide pins 242 as shown in FIG. 1 which may be aligned with and received in mating sockets 244 disposed in mounting assembly 270 to facilitate mounting the space transformer to the mounting assembly. Space transformer 240 may be supported from mounting assembly 270 and/or testing PCB 210 via threaded fasteners 261 or any other suitable means. In one embodiment, as shown, space transformer 240 may be mounted to both testing PCB 210 and the mounting assembly 270.

Figure 3:
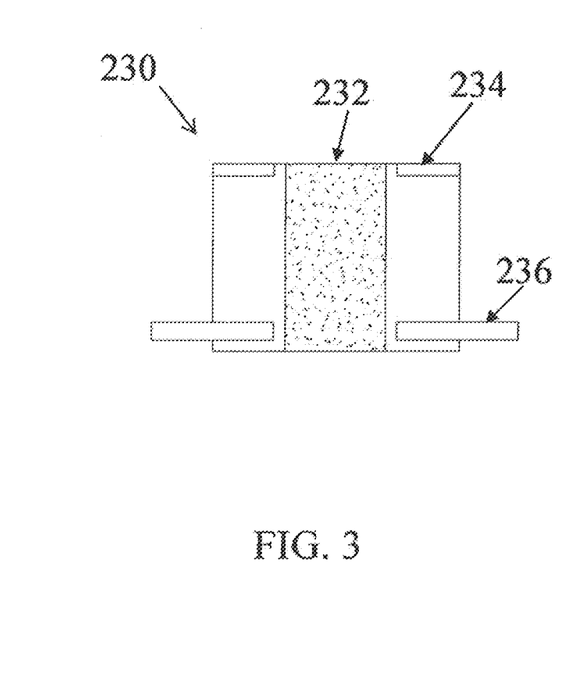
FIG. 3 is a partial cross-sectional side view of one embodiment of the interposer in FIG. 1.

Interposer 230 provides an electrical interface between the conductive wire leads 250 in the space transformer 240 and contacts on the testing probe head 260. Referring to FIG. 1, interposer 230 may be a passive interposer formed of a substrate containing a plurality of vertically-oriented cylindrical conductive vias 232 that pass completely through the substrate. In one embodiment, as shown in FIG. 3, the substrate may be a made of a compressible material such as without limitation silicone rubber to add flexibility to the testing probe card 200 for absorbing initial contact stresses occurring when engaging the testing probe head 260 with the DUT during testing and/or to conform to and compensate for possible DUT or probe non-planarity situations. An upper portion of a compressible interposer 230 may include a thin flexible polymer mesh 234 disposed proximate to or on the top surface and a lower portion may include a sheet 236 made of a relatively more rigid material disposed proximate to or on the bottom surface. In some embodiments, sheet 236 may be without limitation FR-4 or FR-5 (UL grade designation for Flame Retardant Class 4 or 5) glass reinforced epoxy laminate sheet made of woven fiberglass cloth and an epoxy resin binder that is flame resistant. The conductive vias 232 in one embodiment may be made of any suitable conductive metal powder such as without limitation tungsten, copper, nickel, and alloys thereof.

In alternative embodiments, interposer 230 may have a relatively rigid substrate construction being made of a relatively non-compressible material. Such materials may include without limitation a silicon substrate, FR-4/FR-5 glass reinforced epoxy laminate sheet, or other suitable rigid materials used for interposes. The cylindrical conductive vias 232, which are disposed in the rigid substrate and may be TSVs in some embodiments where a silicon substrate is used, may be made of any suitable conductive material including without limitation tungsten, copper, nickel, or alloys thereof. In some embodiments, a rigid interposer may include a redistribution layer fabricated on one surface (called an RDL). Thus the interposer 230 could physically and electrically convert the dense/finer pitch pads facing the probe side to the pads with relaxed pitch on the wiring side.

Interposer 230 may be mounted below and to the underside of space transformer 240 by any suitable means commonly used in the art, such as without limitation via threaded fasteners 261 in some embodiments as shown in FIG. 1.

Referring again to FIG. 1, testing probe head 260 includes a support substrate 262, a plurality of conductive metallic through vias, for example through-substrate vias or through-silicon vias (TSV) 264, and a plurality of corresponding conductive metallic testing probes 300 electrically and structurally coupled to the vias. In some embodiments, support substrate 262 may be formed by a conventional semiconductor substrate material such as silicon commonly used in the art.

Figure 14:
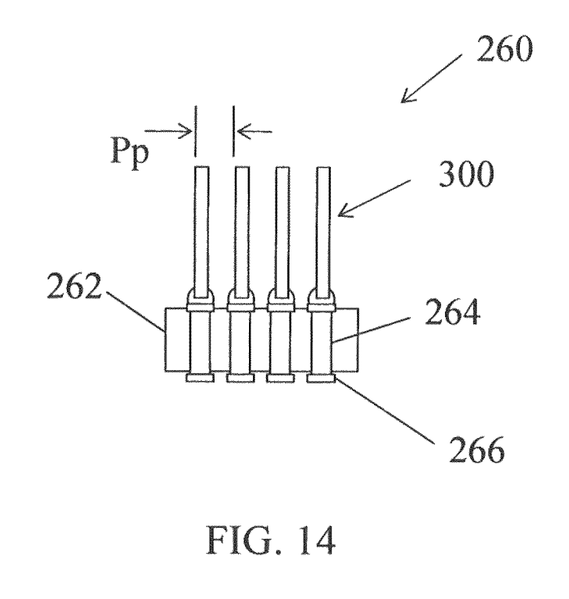

Referring to FIGS. 1 and 14, vias 264 may be made of any suitable conductive material including without limitation metals such as copper or tungsten. Vias 264 extend completely through support base 262 and may be terminated at each end by a relatively flat and broadened conductive metallic surface contact pad 266. Vias 264 function to transfer electrical test signals through the support base substrate both to and from testing PCB 210 for testing the dies or DUTs 100. Vias 264 and contact pads 266 are formed in support substrate 262 by conventional photolithography, etching, and material deposition techniques used in fabricating semiconductors in silicon wafers.

Referring to FIGS. 1 and 14, the upper set of contact pads 266 are configured, dimensioned, and spaced apart to make electrical contact with vias 232 in interposer 230 when the testing probe head 260 is mounted on the interposer. Accordingly, the upper contact pads 266 may have a lateral spacing or pitch that matches the pitch of vias 232 to eliminate the need for redistribution layer conductors to alter pitch spacing. The lower set of contact pads 266 will be electrically coupled to testing probes 300 as further described herein.

Referring to FIGS. 1 and 14, testing probes 300 extend outwards from and generally perpendicular in some embodiments to support substrate 262 as shown. Probes 300 are configured and arranged for mating with corresponding test contacts 110 on a DUT 100 to be tested. Testing probes 300 may have a pitch Pp that matches the pitch Pt of test contacts 110. In one exemplary embodiment, pitches Pp and Pt may be about 40 microns. In some embodiments, test contacts 110 may be test pads or microbumps as shown in FIG. 1 such as those found on a 3D IC package. Testing probes 300 provide conductive paths for electrically connecting testing PCB 210 with the DUTs 100 in the wafer for wafer level burn-in testing.

Figures 4, 5:
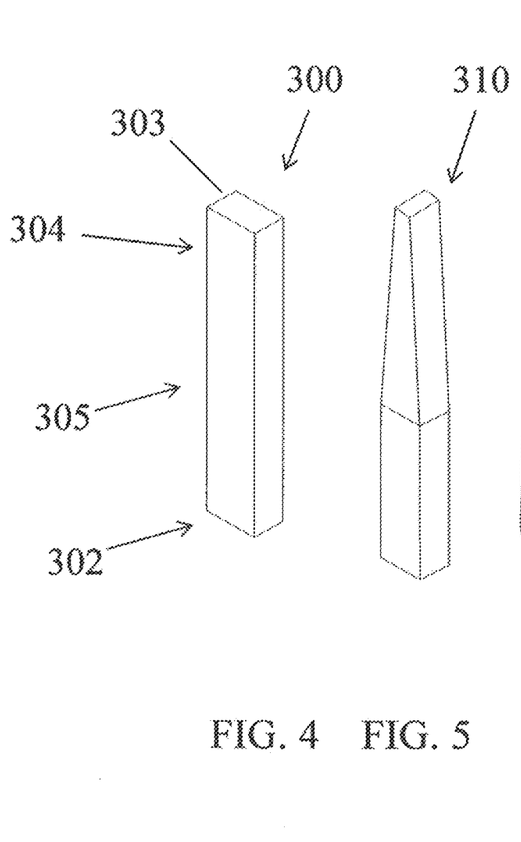
FIGS. 4-8 show exemplary embodiments of testing probes useable in the testing probe card of FIG. 1.
Figure 21:
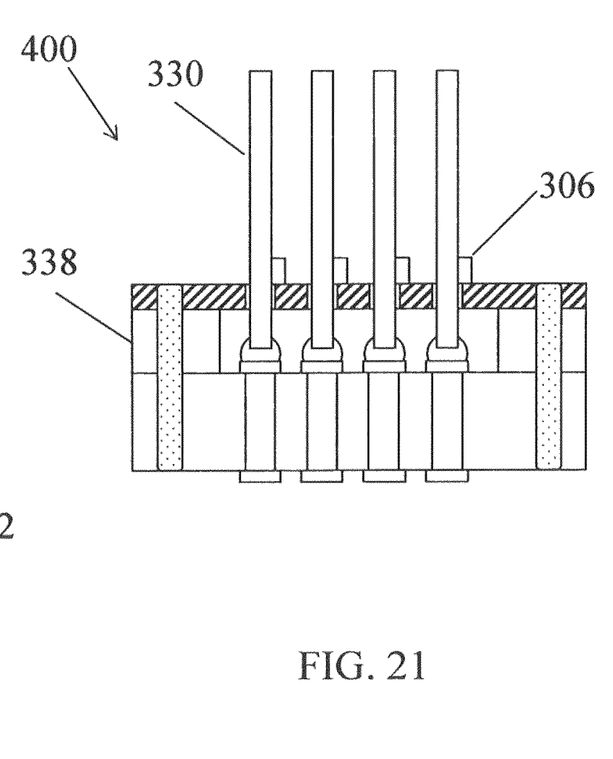

Referring to FIGS. 1, 4, and 14, testing probes 300 are generally pin-like and vertically elongated may have a relatively rigid shaft with a structural beam-like construction and configuration. In some embodiments, probes 300 may be cantilevered from support substrate 262 without intermediate or dual support near opposing upper and lower ends of each probe. Each probe has a base portion 302 attached to support substrate 262, a tip portion 304 with a free end defining a tip 303 configured for engaging test contacts 110 on DUT 100, and an intermediate portion 305. In other embodiments, as shown in FIG. 21 for example and further described herein, an intermediate alignment and support guide plate 332 may be provided to help support and prevent lateral permanent deformation and non-planarity of the probe tips, in addition to possible breakage during repetitive use and thermal cycles from applying an electrical load to wafers being tested.

Testing probes 300 may be of any suitable length, transverse cross-sectional shape, and configuration to fit the intended application so long as suitable pitch spacing Pp may be provided to match the pitch Pt of testing contacts 110 on the DUT 100 for wafer level testing. In some embodiments, testing probes 300 may have a generally rectilinear (e.g. square or rectangular) cross-sectional shape (viewed transverse to the axis or length of the probe), which in some embodiments may result from one exemplary probe fabrication technique that may be used such as reverse wire electrical discharge machining ("R-WEDM") commonly used for MEMS manufacture, as further described herein. In one exemplary embodiment for wafer level testing of 3D IC packages, probes 300 may have an approximate cross-sectional width (measured across each flat side) of about 20 microns to support testing of a plurality of 20 micron diameter microbump test contacts 110 in a 40 micron pitch Pt testing contact array on a DUT 100. The pitch Pp of such probes 300 in testing probe head 260 may correspondingly be about 40 microns also.

Figures 6, 7, 8:
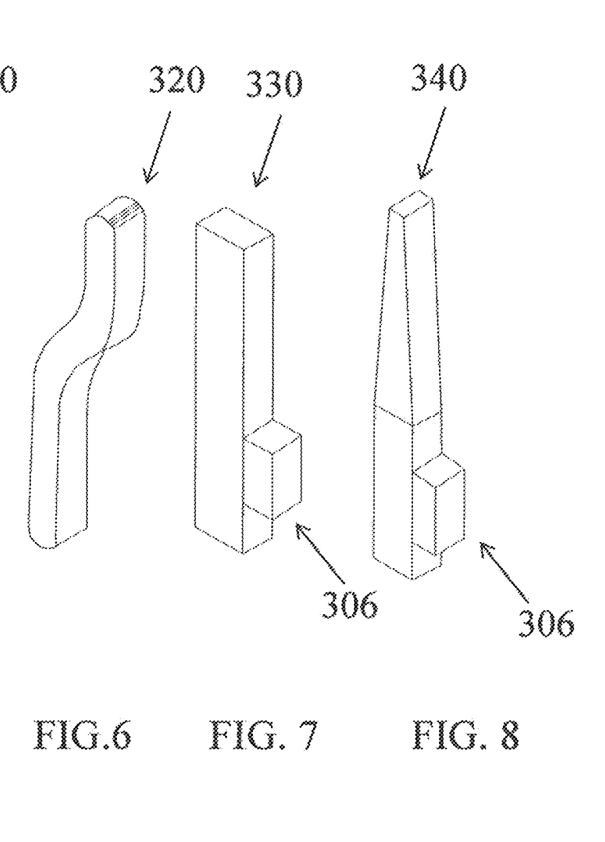

FIGS. 4-8 show some of the possible embodiments and configurations of testing probes formed according to principles of the present disclosure. The testing probes have a free end opposite support substrate 262 with a tip 303 configured and dimensioned for contacting a corresponding testing pad 110 on a DUT 100. FIG. 4 shows a single probe 300 having a rectangular or square beam shape. Probe 300 has a uniform transverse cross-section in size for its entire length. FIG. 5 shows substantially the same configuration, but probe 310 has a tapered or reduced width pyramidal shaped tip portion 304 for engaging correspondingly smaller diameter testing microbump contacts 110 on a DUT 100. FIG. 6 depicts a probe 320 having a curved beam shape with a tip portion 304 which is axially offset from base portion 302 to add flexibility to the probe. Probe 320 otherwise may have a uniform transverse cross-section for its entire length as shown, or alternatively may have a tapered tip portion 304 configured similarly to FIG. 5. Also, as further shown in FIG. 6, any of the probes may have rounded tips for enhancing engagement with test contacts 110 on DUT 100 (shown in FIG. 1) which are formed during fabrication of the probes and probe array.

Each testing probe shown in FIGS. 4-8 may be considered to have a base portion 302, a tip portion 304 with a free end defining a tip 303, and an intermediate portion 305 similarly to that shown in FIG. 4.

Figure 20:
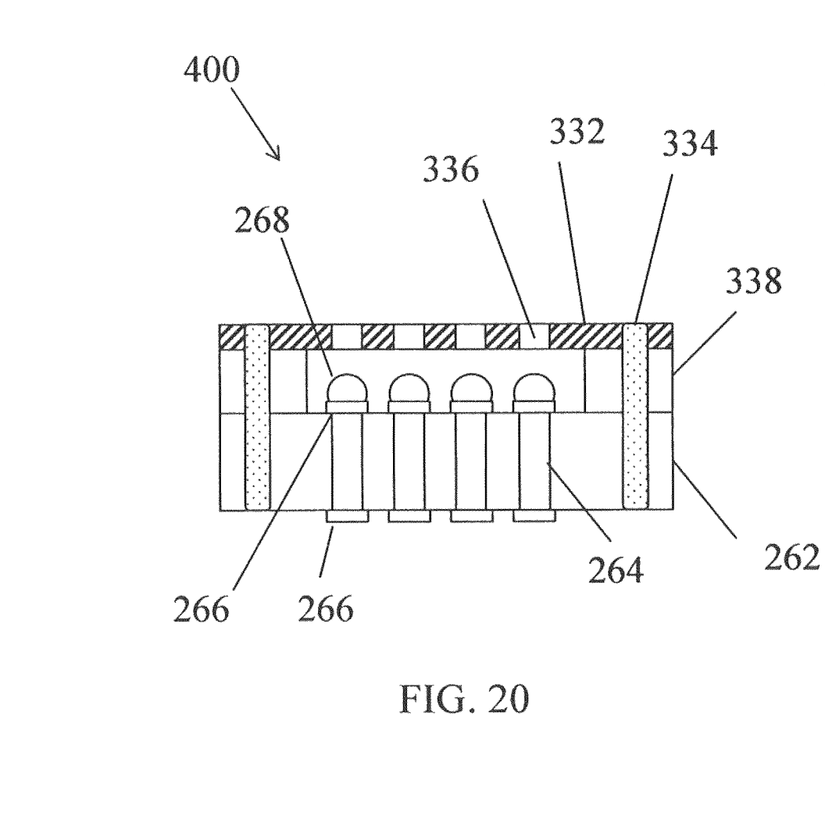
FIGS. 20 and 21 show partial cross-sectional side views of an alternative embodiment of the testing probe head of FIG. 2 with a probe guide plate.

Exemplary probes 330 and 340 shown in FIGS. 7 and 8, respectively, are similar in configuration to the probes shown in FIGS. 4 and 5. However, probes 330 and 340 have a stopper 306 formed on at least one lateral side of the probe. Stopper 306 protrudes laterally outwards from probes 330, 340, and are dimensioned and configured to engage an intermediate alignment and support guide plate 332 as shown in FIGS. 20 and 21. These figures show probes 330 mounted through guide plate 332; however, the same principle applies to probes 340 with stoppers 306.

Guide plate 332 may be mounted on support substrate 262 of testing probe head 260 via spacers 338 which space the guide plate away from substrate 262 forming a gap therebetween, as shown in FIGS. 20 and 21. In some embodiments, a guide pins 334 may be provide to align and mount guide plate 332 to substrate 262 via the spacers 338. In other embodiments, guide pins 334 may be omitted. Guide plate 332 and spacers 338 may be made of an electrically non-conductive and insulating material to avoid shorting the electrical signals passing through probes 300 during testing of the DUTs 100. In some embodiments, the guide plate 332 and spacers 338 may be one integral unitary structure/part which is made of single material such as without limitation machinable ceramic, silicon, or silicon nitride. In other embodiments, the guide plate and spacers may be formed as two or more separate parts which are joined together such as glued by adhesives or mechanically fastened by screws.

With continuing reference to FIGS. 7-8 and 20-21, guide plate 332 may contain a plurality of apertures 336 configured and dimensioned to receive at least one end and a portion of probes 330 (or probes 340) therethrough. An aperture 336 is therefore provided for each through silicon via 264 in support substrate 262 of the test probe head. Apertures 336 are laterally arranged and spaced to have a pitch that matches the pitch of vias 264 so that the apertures are each concentrically aligned with a corresponding via below. During assembly, one end of probes 330 or 340 are inserted through apertures 336 until the laterally extending stoppers 306 engage guide plate 332, thereby limiting the insertion depth of the probes.

Advantageously, the foregoing probe assembly with guide plate 332 is intended to provide improved probe planarity (i.e. tips of probes terminating and falling uniformly along a single plane defined by the probe tips) and better positioning of the probes for completing the reflow soldering assembly further described herein. Stoppers 306 are spaced between the ends of the probes 330, and in one embodiment may be located closer towards the base portion 302 than the tip portion 304 of each probe. Guide plate 332 therefore provides both intermediate lateral/transverse support of each probe via apertures 336 and axial support via stoppers 306 thereby enhancing the structural strength of this testing probe head 400.

A completed testing probe head 400 with guided and supported testing probes 330 is shown in FIG. 22.

Figure 10A:
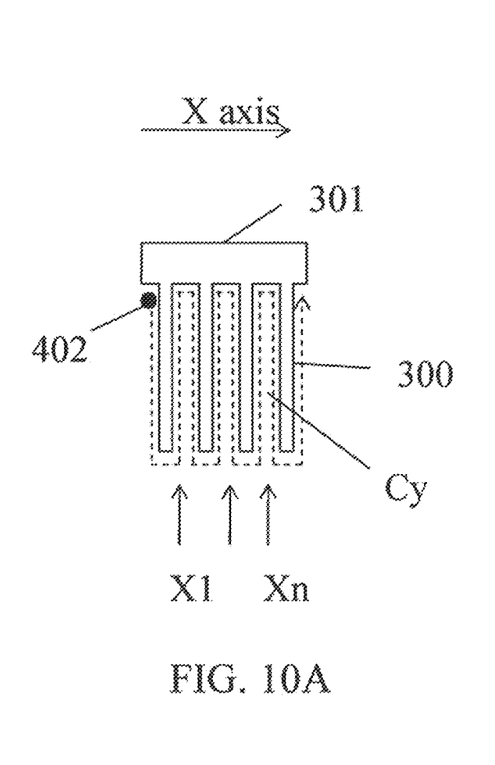
Figure 10B:
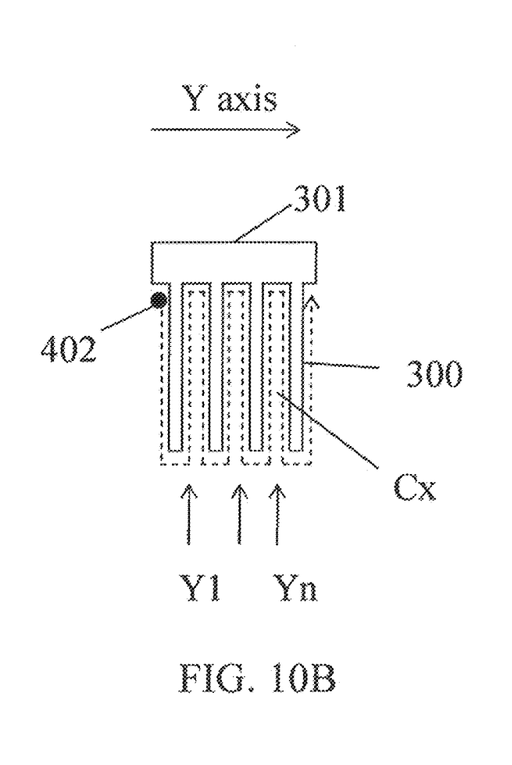

It will be appreciated that in some embodiments, at least one but not all of the testing probes need to have stoppers to limit the insertion depth of the full probe array. Since the probes are still collectively attached to the temporary workpiece base 301 as shown in FIGS. 10A and 10B, only a few space apart probes 330 or 340 of the design as shown FIG. 7 or 8 need to be provided in the probe array to effectively limit the insertion depth all the probes in the array through guide plate 332. Accordingly, in some embodiments, the probe array may include a combination of both probes 300 or 310 with straight shafts (see, e.g. FIGS. 4 and 5) with at least one probe 330 or 340 having a stopper 306.

Figure 15:
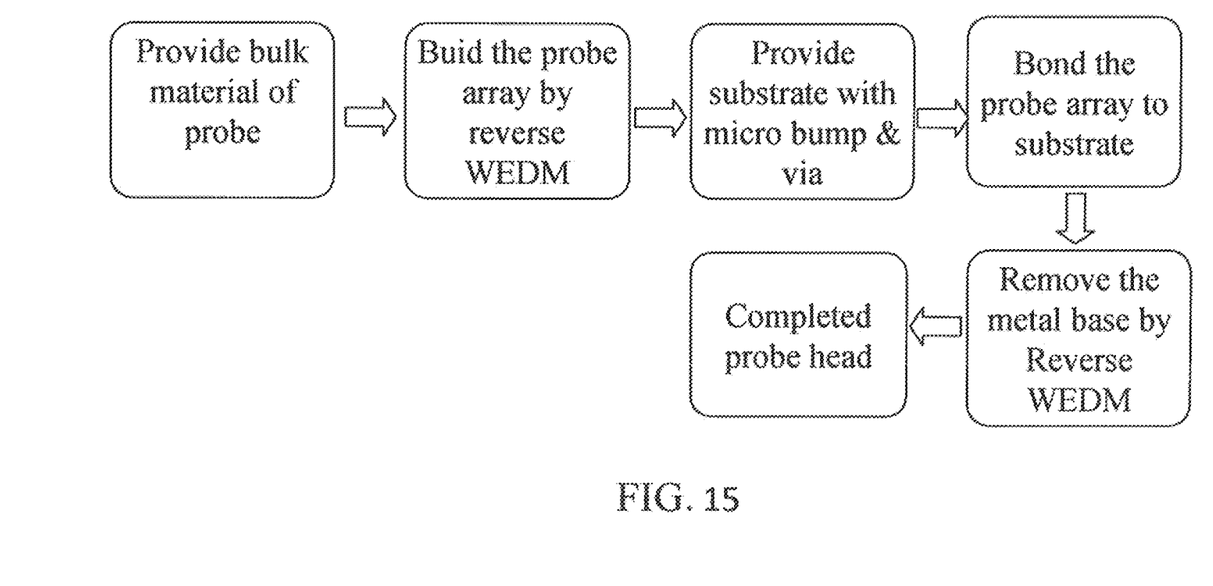
FIG. 15 is a block flow diagram showing the basic method steps in FIGS. 9-14.

An exemplary method for fabricating test probes 300 and assembling test probe head 260 as shown in FIGS. 1 and 14 will now be described. Specific reference is made to FIGS. 9-15, with FIG. 15 showing a flow chart of the basic fabrication process steps involved in making testing probe head 260. The various process steps that may be used including photolithography, material deposition, material removal, machining, forming, and others to be described below refer to conventional processes known and commonly used in MEMS (micro-electro-mechanical systems) or semiconductor fabrication unless otherwise noted.

Figure 9:
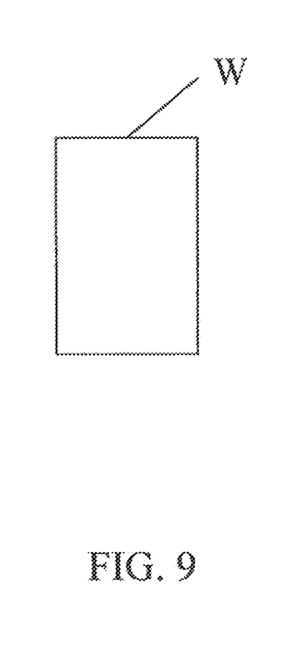
FIGS. 9-14 show exemplary sequential method steps for fabricating the testing probe head of FIG. 2.

Referring to FIGS. 9 and 15, a workpiece W is first provided in the form of a monolithic block of bulk raw material from which probes 300 will be formed is provided in the first step. The block of material is dimensioned so that a complete laterally extending array of testing probes 300 for the testing probe head 260 may be fabricated from the single block of material simultaneously. In the embodiment shown, where a rectilinear probe array (i.e. square or rectangular) is to be fabricated, the raw material block has a complementary rectilinear configuration.

The block of raw material for workpiece W will be selected based on the material intended for the testing probes 300. In some embodiments, the raw material may be any conductive metal or metal alloy suitable for use as testing probes. In some representative embodiments, without limitation, the raw material may be tungsten palladium, tungsten carbide, palladium, cobalt, nickel, hard gold, soft gold, tungsten, rhenium, rhodium, or alloys thereof. In other embodiments, the raw material may be an electrically conductive non-metallic material such as carbon-nanotube in bulk shape.

In the next step shown in FIGS. 10 and 15, the testing probe array containing a plurality of individual probes 300 is next formed from the monolithic block of raw material. In one embodiment, reverse wire electrical discharge machining ("R-WEDM") commonly used for MEMS manufacture may be used to machine the probes. This process is capable of accurately producing a testing probe array with sufficiently small probe pitch Pp suitable for mating with 3D IC package microbump arrays pitch Pt (see also FIG. 1). In some embodiments, pitch Pp may be about 40 microns or less.

With continuing reference to FIGS. 10 and 15, one end of the bulk raw material block or workpiece W or will serve as a temporary expendable common base 301 for supporting the individual testing probes 300 during the probe formation and fabrication process until attached to support substrate 262. In one embodiment, R-WEDM may be used to cut or form completed probes in an essentially two-part, bi-directional machining process, which will be further described for convenience with reference to the arbitrary X-Y-Z coordinate system drawn in FIG. 2 with respect to the fabrication base 301. The completed testing probe 300 array will correspondingly extend laterally in both the X and Y directions, as well as in the Z direction normal to the base 301 defining the height or length of the completed test probes.

R-WEDM is basically an automated CNC (computer numerical control) process generally utilizing a thin single strand of metal discharge cutting wire held between computer-controlled moveable guides. The discharge wire is electrically energized and fed through the bulk raw material or workpiece W, which may be submerged in a tank of dielectric fluid such as deionized water, to make a series of cuts. The wire may be articulated in numerous directions and orientations to make machine components having a variety of configurations. Electrical discharges or sparks from the wire cuts or erodes the workpiece material. Electric discharge machines (EDM) are commercially available from various companies, such as for example GF AgieCharmilles of Lincolnshire, Ill.

One embodiment of an R-WEDM process used for forming embodiments of a testing probe array according to the present disclosure may utilize a micro-sized brass discharge wire 402. In one non-limiting representative example, discharge wire 402 may have a diameter of about 20 microns that may be used for producing a test probe array with a pitch spacing of about 40 microns and individual testing probe widths of about 20 microns. The diameter of the wire used will be based at least in part on the pitch spacing and final width (in both X and Y directions) of the testing probes 300, and also must compensates for the spark or electrical discharge produced by the wire 402 which will cut a path or kerf larger than the diameter of the wire itself (i.e. overcut).

Initially, the probe bulk material block or workpiece W (see FIG. 9) is first mounted and secured in an EDM machine capable of implementing the R-WEDM process. Next the discharge wire 402, which is typically supported by wire guides, is positioned near one of the lateral sides of the workpiece W and spaced axially inwards (in the Z axis direction) a short distance from the end of temporary workpiece base 301 (see FIG. 10).

Figure 2:
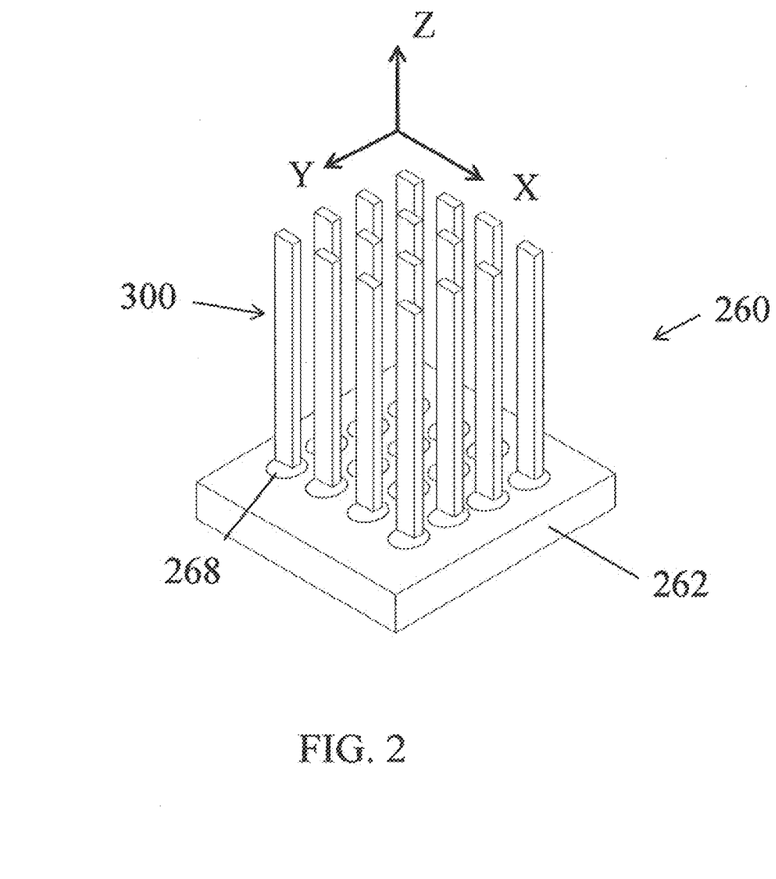
FIG. 2 is a perspective view of one embodiment of the testing probe head in FIG. 1.
Figure 16:
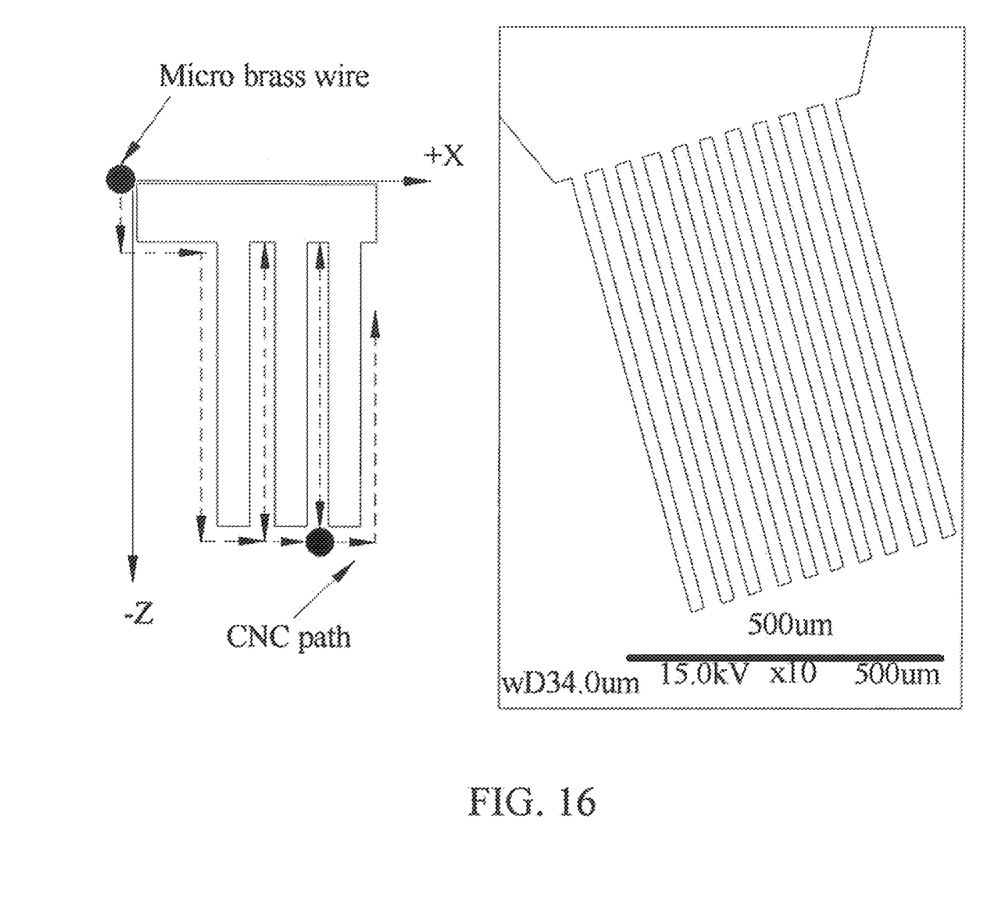
FIGS. 16-19 are scanning electron microscope images taken during fabrication of the testing probe head using the method shown in FIGS. 9-14.
Figure 17:
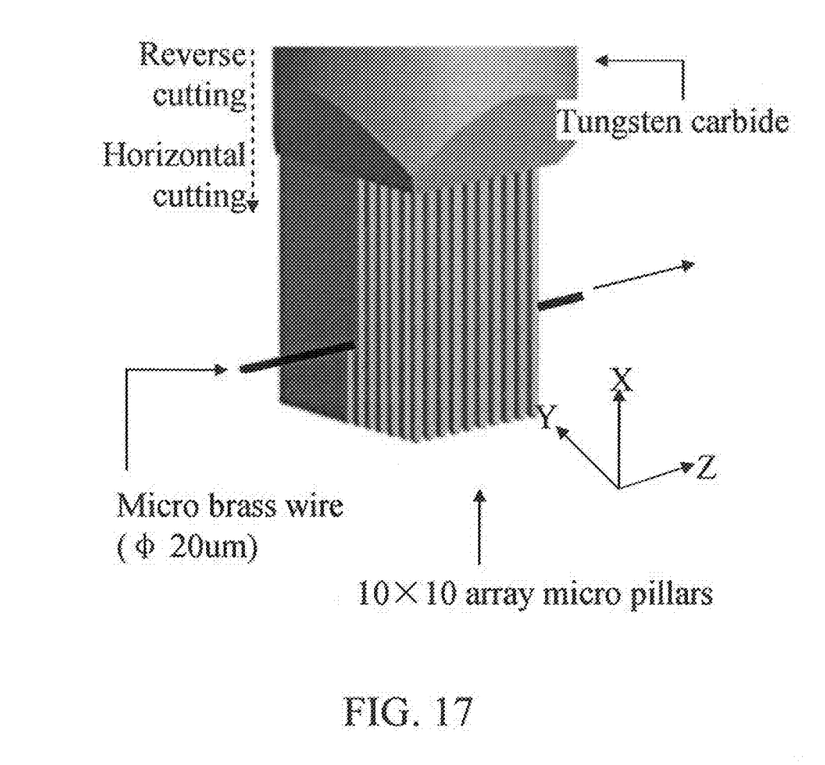

With reference now to FIGS. 2, 10A, and 15, the first part of the two-part, bi-directional R-WEDM probe cutting process involves cutting a plurality of channels Cy extending across workpiece W in the Y axis direction. In one embodiment, this may be accomplished by advancing energized discharge wire 402 progressively and horizontally in a first axial X-axis direction across the bulk material block or workpiece W in the X-Y plane (see dashed wire path in FIG. 10A). Wire 402 has a length that extends completely across the workpiece W in the Y axis direction so that channels Cy used to form probes 300 may be fully cut for all probes simultaneously across the full width of the workpiece. As the discharge wire 402 axially advances, the wire is then intermittently and repetitively moved vertically into and out of the workpiece W in the Z axis direction (along the Y-Z plane) to form a plurality of channels Cy extending in the Y axis direction and transverse to the X-axis direction of motion of the discharge wire 402. Channels Cy are spaced apart along the X axis leaving concomitantly a plurality of individual rectilinear-shaped sheets of probe material which are spaced apart in the X direction, but have continuous width across the workpiece W in the Y axis direction (see, e.g. scanning electron microscope images in FIGS. 16 and 17).

The depth of channels Cy cut into the workpiece W along the Z-axis do not extend completely through the workpiece as shown in FIG. 10A leaving temporary workpiece base 301 intact for supporting the plurality of probes to be formed for the entire probe formation process.

Accordingly, referring to FIG. 10A, the first part of the foregoing probe cutting process involves temporarily stopping axial motion of discharge wire 402 at a plurality of predetermined axial intervals or cutting positions X1 . . . Xn (where n=number of X axis axial cutting positions) to cut channels Cy. The discharge wire W is therefore horizontally and axially moved to a first cutting position X1, the wire is then moved into and out of workpiece W along the Z axis to form a first channel Cy, wire 402 is then moved to the next axial cutting position Xn, the wire is then moved vertically again to cut a second channel Cy, and so on until the desired number of channels Cy are cut. The probes 300 now have been partially formed with the desired axial width and spacing or pitch of the probes along the X axis; the width and pitch of the individual probes along the Y axis yet to be cut as described below.

The foregoing process is controlled by the automated CNC process and R-WEDM machine with the appropriate axial cutting positions, depth of cuts in the Z-axis, and other relevant process parameters including controlled movement of the discharge wire 402 being preprogrammed into the machine processor. It is well within the ambit of one skilled in the art to program and control the R-WEDM machine cutting process to achieve the desire location, depth, and size of the cuts to be made in workpiece W.

With reference to FIGS. 2, 10B, and 15, the second part of the R-WEDM probe cutting process next involves cutting a plurality of channels Cx extending across workpiece W in the X axis direction perpendicular to and intersecting channels Cy already formed in FIG. 10A in the same manner previously described. In one embodiment, this may be accomplished by advancing energized discharge wire 402 progressively horizontally a second axial Y direction across the bulk material block or workpiece W within the X-Y plane. The second axial cut direction is therefore oriented 90 degrees from the first axial cut direction shown in FIG. 10A. As the wire 402 axially advances, the wire is stopped at a plurality of Y-axis positions Y1 . . . Yn where the wire is vertically moved into and out of the workpiece W in the Z axis direction (in the X-Z plane) to cut channels Cx through the spaced apart sheets of probe material previously formed. Cutting channel Cx in the sheets of probe material forms a plurality of individual pillars at the intersections between channels Cy and Cx. The pillars each define an elongated probe 300, which are now arranged spaced apart in both the X and Y directions (see also scanning electron microscope images in FIGS. 17 and 18). The probes 300 each now generally have the desired final lateral or axial width and a pitch or spacing along both the X axis and Y axis.

In some embodiments, as shown in FIG. 2, the probes 300 formed via cutting channels Cy and Cx may have a rectilinear (i.e. square or rectangular) cross-sectional shape in the X-Y plane. It should be noted that in FIGS. 10A and 10B, the free ends of the presently formed probes 300 shown (i.e. ends not still attached to temporary base 301) will actually define the base portion 302 of the probes for attachment to supporting substrate 262 as described below.

Figure 11:
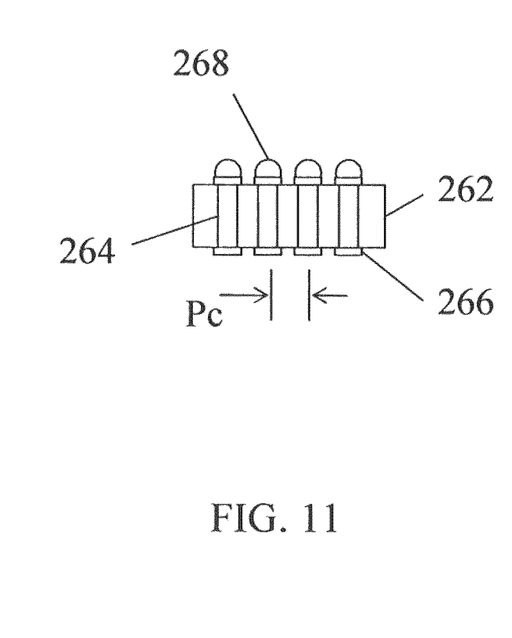

Referring now to FIGS. 2, 11, and 15, the testing probe head 260 fabrication and assembly process next continues with providing support substrate 262. Substrate 262 already contains fully formed through silicon vias 264 and upper/lower contact pads 266 previously formed by conventional MEM or semiconductor fabrication processes well known in the art. A plurality of conventional conductive solder microbumps 268 are formed on one side of substrate 262 on contact pads 266 as shown in FIG. 11 which will be used to electrically interconnect each probe 300 to a corresponding contact pad and via 264.

Figure 12:
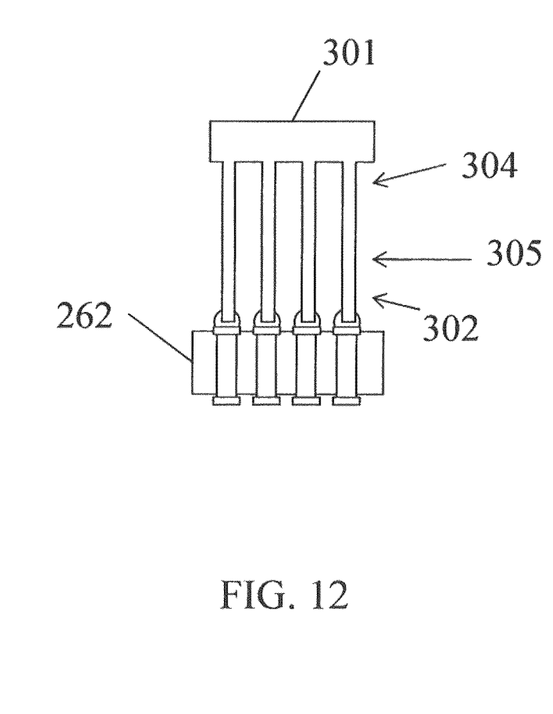

Referring now to FIGS. 2, 12, and 15, the testing probes 300 are next physically and electrically connected to conductors in support substrate 262 of testing probe head 260. In one embodiment, the probes may be connected to substrate 262 using solder joints. To accomplish this, the workpiece W with plurality of completed testing probes 300 is advanced toward substrate 262. The free ends of each finished testing probe 300 pillar shown in FIG. 10B are then abuttingly engaged with a corresponding solder bump 268 on substrate 262 and held in position. The probe-substrate assembly may then be moved to a reflow soldering oven and heated to melt the solder bumps 268 using any suitable heat source such as hot gas, infrared heat, etc. The melted solder flows and creates a physical and electrical connection to the free ends of the testing probes 300, which will define base portion 302 of each probe. The assembly now appears as shown in FIG. 12 with base portion 302 of each probe attached to support substrate 262 and opposite tip portion 304 of each probe still attached to temporary fabrication base 301.

Figure 13:
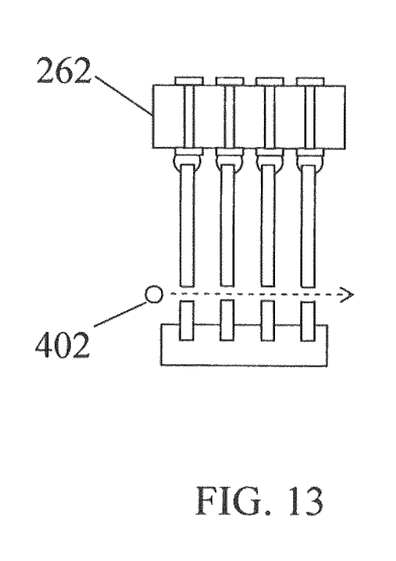

Referring now to FIGS. 2, 13, and 15, temporary base 301 is next severed and removed from the probe assembly. In one embodiment, R-WEDM may be used to laterally cut across the probes 300 in either the X or Y axial direction more proximate to the base 301 than substrate 262. This final cutting step will define the finished height or length of the testing probes 300.

Figure 18:
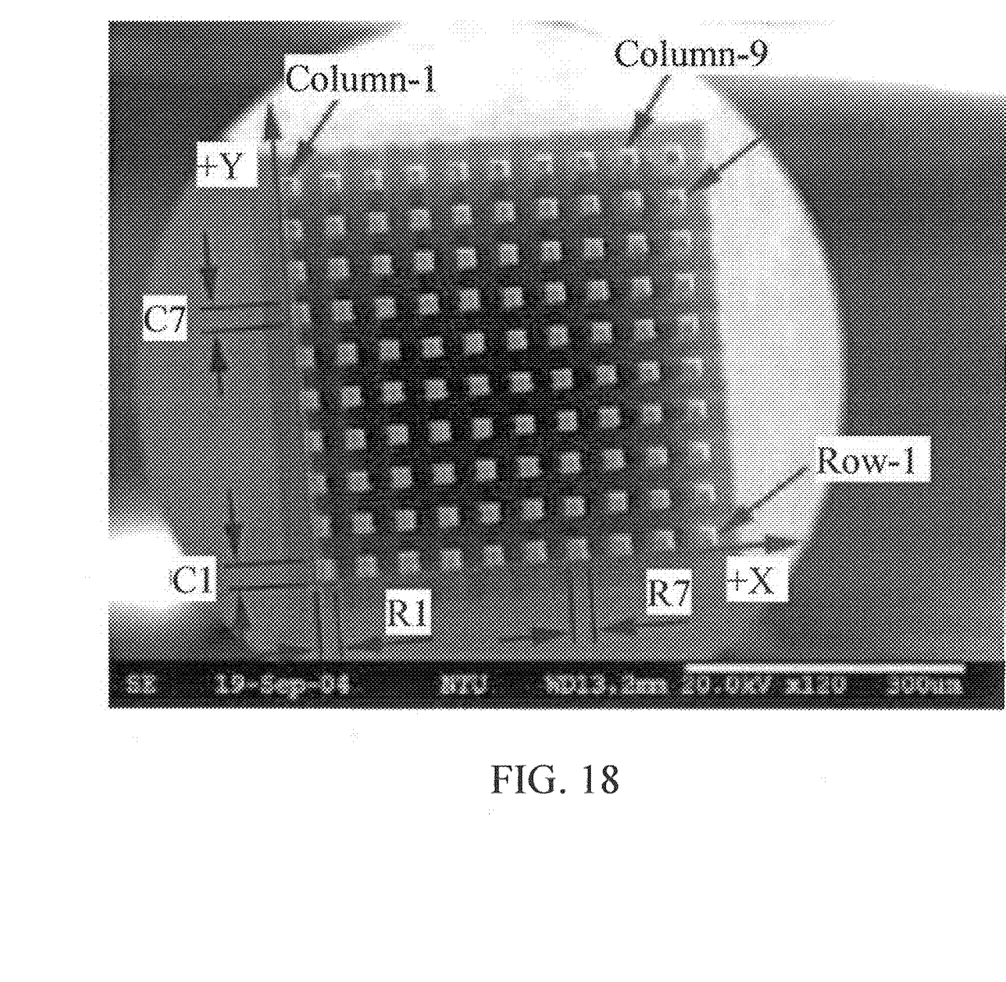
Figure 19:
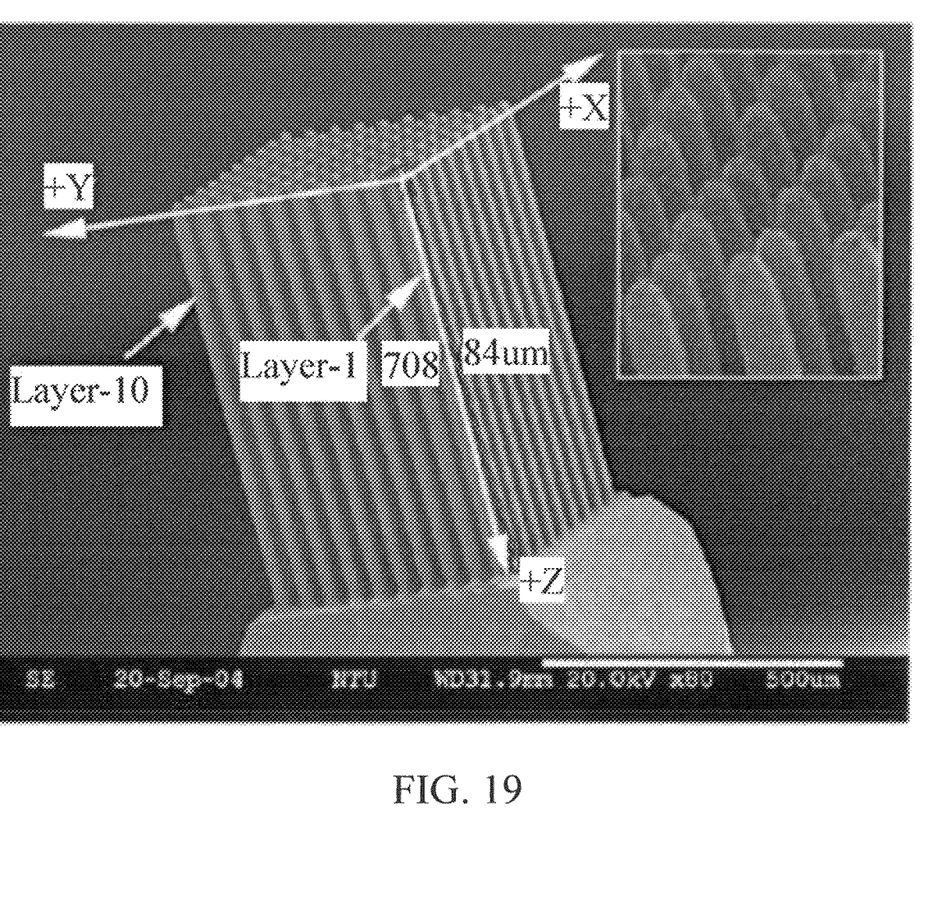

The completed testing probe head 260, as shown in FIGS. 2 and 14, is now ready for mounting to testing probe card 200. FIGS. 18 and 19 show scanning electron microscope images of an actual testing probe assembly formed according to an embodiment of the present disclosure using R-WEDM.

It will be noted that the workpiece W and R-WEDM machining process may be conducted in any suitable orientation other than the foregoing orientations provided merely for convenience in describing the process. The disclosure is therefore not limited to R-WEDM machining in any particular orientation so long as the testing probes 300 may be properly fabricated.

There are numerous advantages of the foregoing probe formation process. First, all testing probes 300 are simultaneously formed and mounted to the testing probe head in a single solder reflow operation as opposed to being individually assembled on a piece-meal basis as in prior manual probe mounting operations. This results in more precise dimensional accuracy of the testing probes and significantly less time to assemble the probes to the testing probe head. The present process is also fully automated and eliminates manual handling and potential damage of the probes resulting in lower reject rate. The present probes also have a more rigid and durable constructions than prior flexible testing probes or pins. Furthermore, the present probe fabrication and testing probe head assembly steps permit high probe count and fine/smaller pitch spacing of probes to meet the demand for 3D IC package microbump arrays on DUTs.

It will be appreciated that if a testing probe head 400 with guided testing probes 330, 340 as shown in FIG. 21 is to be fabricated, the free probe ends are simply inserted through apertures 336 in guide plate 332 (see FIG. 20) prior to solder reflow process shown in FIG. 12 and described above. The other fabrication process steps process steps described herein remain the same with exception that the R-WEDM machining step for probes 330, 340 will include forming stoppers 306 as part of the process.

It will further be appreciated that any of the testing probe configurations shown in FIGS. 4-8 and other may be formed using R-WEDM in some embodiments. The computer-controlled R-WEDM machines are capable of moving discharge W in a plurality of other directions along multiple axes other than merely the X, Y, and Z axes. Accordingly, numerous intricate shapes and contours may be cut to form testing probes having a wide variety of configurations adapted to suit the intended testing application.

According to one embodiment of the present disclosure, a test probe card for wafer level testing includes a mounting assembly, a printed circuit board including wafer level testing circuitry which is supported by the mounting assembly, and a testing probe head including a probe array comprising a plurality of rigid metallic testing probes. The testing probes are fixedly attached to and cantilevered from a silicon substrate including a plurality of metal through silicon vias. The testing probes are electrically coupled to the vias and arranged to engage a corresponding testing contacts in a device under test in a semiconductor IC package. The probes are operable to receive and transmit electrical signal between the printed circuit board and device under test for conducting wafer level testing. In some embodiments, the testing probes are fixedly attached to the silicon substrate via a base portion of the probe which is soldered to the vias or conductive surface contact pads coupled to the vias. The probes may be soldered using flip chip soldering reflow process. In some embodiments, the testing probe card may further include a guide plate disposed between opposite ends of the test probes. The guide plate includes a plurality of apertures through which the testing probes are inserted. At least one testing probe includes a stopper positioned to engage the guide plate and thereby limit the insertion depth of the at least one testing probe through the guide plate for proper positioning of the probe.

In one embodiment according to the present disclosure, a method for fabricating a semiconductor test probe head includes: providing a workpiece made of an electrically conductive material; cutting a plurality of first channels in the workpiece in a first axial direction using an electric discharge wire; cutting a plurality of second channels in the workpiece in a second axial direction using the electric discharge wire, the first and second channels intersecting and forming a plurality of a pillars defining testing probes at the intersections between the first and second channels; and connecting the probes to electrical conductors formed in a support substrate, the probes and substrate defining a testing probe head. Cutting of the first and second channels may be performed using reverse wire electric discharge machining (R-WEDM) in an electric discharge machine. The connecting step may be performed by soldering the probes to the conductors or surface contact pads coupled to the vias through use of solder bumps and a soldering reflow process.

In another embodiment, a method for fabricating a semiconductor test probe head includes: (a) providing a workpiece made of an electrically conductive metallic material, the workpiece defining an X-Y-Z coordinate system; (b) mounting the workpiece in an electric discharge machine having an articulating electric discharge wire; (c) advancing the discharge wire in a first direction along the X axis; (d) intermittently moving the discharge wire through the workpiece in a second direction along the Z axis at a plurality of intervals spaced along the X axis, the wire cutting a plurality of first channels in the workpiece extending in the Y axis direction; (e) advancing the discharge wire in a third direction along the Y axis; (f) intermittently moving the discharge wire through the workpiece in the second direction along the Z axis at a plurality of intervals spaced along the Y axis, the wire cutting a plurality of second channels in the workpiece extending in the X axis direction; (g) forming an array of testing probe pillars defined by the first and second channel cuts; (h) providing a support substrate comprised of silicon having a plurality of metallic through silicon vias; and (i) soldering the probes to the conductors, wherein the support substrate and testing probe pillars define a testing probe head.

While the foregoing description and drawings represent or exemplary embodiments of the present disclosure, it will be understood that various additions, modifications and substitutions may be made therein without departing from the spirit and scope and range of equivalents of the accompanying claims. In particular, it will be clear to those skilled in the art that the present disclosure may be embodied in other forms, structures, arrangements, proportions, sizes, and with other elements, materials, and components, without departing from the spirit or essential characteristics thereof. In addition, numerous variations in the methods/processes and/or control logic as applicable described herein may be made without departing from the spirit of the disclosure. One skilled in the art will further appreciate that the disclosure may be used with many modifications of structure, arrangement, proportions, sizes, materials, and components and otherwise, used in the practice of the disclosure, which are particularly adapted to specific environments and operative requirements without departing from the principles of the present disclosure. The presently disclosed embodiments are therefore to be considered in all respects as illustrative and not restrictive, the scope of the disclosure being defined by the appended claims and equivalents thereof, and not limited to the foregoing description or embodiments. Rather, the appended claims should be construed broadly, to include other variants and embodiments of the disclosure, which may be made by those skilled in the art without departing from the scope and range of equivalents of the disclosure.

What is claimed is:

1. A method for fabricating a semiconductor test probe head comprising:

providing a workpiece made of an electrically conductive material;

cutting a plurality of first channels in the workpiece in a first axial direction using an electric discharge wire;

cutting a plurality of second channels in the workpiece in a second axial direction using the electric discharge wire, the first and second channels intersecting and forming a plurality of a pillars defining testing probes at the intersections between the first and second channels, wherein the pillars are supported and cantilevered from a common support base formed integrally with the pillars from the workpiece during cutting the first and second channels;

connecting the testing probes to electrical conductors formed in a support substrate, the testing probes and the support substrate defining a testing probe head, and severing the common support base from the testing probes after connecting the testing probes to the electrical conductors in the support substrate.

2. The method of claim 1, wherein cutting the first and second channels is performed using reverse wire electric discharge machining (R-WEDM) in an electric discharge machine.

3. The method of claim 1, wherein the connecting step involves soldering the testing probes to the electrical conductors via solder bumps using a soldering reflow process.

4. The method of claim 3, wherein the support substrate comprises silicon and the electrical conductors are formed by a plurality of metallic through silicon vias.

5. The method of claim 1, wherein the testing probes are each soldered to a corresponding conductor in the support substrate simultaneously in a single operation.

6. The method of claim 1, wherein the support base is severed using an electric discharge wire.

7. The method of claim 1, wherein the testing probes are elongated and have a rectilinear cross-sectional shape viewed transverse to a length of the probes.

8. The method of claim 7, wherein the testing probes have a maximum transverse width of about 20 microns.

9. The method of claim 8, wherein the testing probes have a pitch of about 40 microns.

10. The method of claim 1, further comprising a step of forming a stopper protruding laterally outwards from at least one testing probe.

11. The method claim 10, further comprising the following steps before connecting the probes to electrical conductors formed in the support substrate:
   inserting one end of the at least one testing probe through an aperture formed in a guide plate spaced above the support substrate; and
   engaging the stopper with the guide plate therein limiting an insertion depth of the at least one testing probe through the guide plate.

12. A method for fabricating a semiconductor test probe head comprising:
   (a) providing a workpiece made of an electrically conductive metallic material, the workpiece defining an X-Y-Z coordinate system;
   (b) advancing an electric discharge wire in a first direction along the X axis;
   (c) intermittently moving the electric discharge wire through the workpiece in a second direction along the Z axis at a plurality of intervals spaced along the X axis, the electric discharge wire cutting a plurality of first channels in the workpiece extending in the Y axis direction;
   (d) advancing the electric discharge wire in a third direction along the Y axis;
   (e) intermittently moving the electric discharge wire through the workpiece in the second direction along the Z axis at a plurality of intervals spaced along the Y axis, the electric discharge wire cutting a plurality of second channels in the workpiece extending in the X axis direction;
   (f) forming an array of testing probe pillars defined by the first and second channel cuts, wherein the test probe pillars are cantilevered from a common support base formed integrally with the testing probe pillars from the workpiece;
   (g) providing a support substrate comprises silicon and electrical conductors formed by a plurality of metallic through silicon vias;
   (h) soldering the testing probe pillars to the electrical conductors, wherein the support substrate and the testing probe pillars define a testing probe head, and
   (i) severing the common support base from the testing probes after soldering the testing probes to the electrical conductors in the support substrate.

13. The method of claim 12, wherein the testing probes are each soldered to a corresponding conductor in the support substrate simultaneously in a single operation.

14. The method of claim 12, wherein the support base is severed using an electric discharge wire.

15. The method of claim 12, wherein the testing probes are elongated and have a rectilinear cross-sectional shape viewed transverse to a length of the probes.

16. The method of claim 15, wherein the testing probes have a maximum transverse width of about 20 microns.

17. The method of claim 12, wherein the testing probes have a pitch of about 40 microns.

18. The method of claim 12, further comprising a step of forming a stopper protruding laterally outwards from at least one testing probe.

19. The method claim 18, further comprising the following steps before connecting the probes to electrical conductors formed in the support substrate:
   inserting one end of the at least one testing probe through an aperture formed in a guide plate spaced above the support substrate; and
   engaging the stopper with the guide plate therein limiting an insertion depth of the at least one testing probe through the guide plate.

* * * * *